United States Patent
Mochizuki et al.

(10) Patent No.: US 11,183,583 B2
(45) Date of Patent: Nov. 23, 2021

(54) VERTICAL TRANSPORT FET WITH BOTTOM SOURCE AND DRAIN EXTENSIONS

(71) Applicant: International Business Machines Corporation, Armonk, NY (US)

(72) Inventors: Shogo Mochizuki, Clifton Park, NY (US); Pietro Montanini, Guilderland, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/858,598

(22) Filed: Apr. 25, 2020

(65) Prior Publication Data

US 2021/0336035 A1   Oct. 28, 2021

(51) Int. Cl.
*H01L 29/66* (2006.01)
*H01L 29/78* (2006.01)
*H01L 29/16* (2006.01)

(52) U.S. Cl.
CPC ........ *H01L 29/66666* (2013.01); *H01L 29/16* (2013.01); *H01L 29/7827* (2013.01)

(58) Field of Classification Search
CPC ..... H01L 21/823431; H01L 21/823821; H01L 21/845; H01L 27/0886; H01L 27/0924; H01L 27/10826; H01L 27/10879; H01L 27/1211; H01L 29/41791; H01L 29/66795–66818; H01L 29/785–7856; H01L 2029/7857–7858; H01L 2924/13067; H01L 29/04–045;
(Continued)

(56) References Cited

U.S. PATENT DOCUMENTS 6,387,758 B1   5/2002   Yu et al.
6,770,534 B2   8/2004   Cho et al.
(Continued)

FOREIGN PATENT DOCUMENTS

WO   WO2017166167 A1   10/2017

OTHER PUBLICATIONS

Kumar et al., "Modeling of a vertical tunneling graphene heterojunction field-effect transistor," arXiv:1206.5077.pdf (Jun. 2012) (15 pages).

*Primary Examiner* — Mohammad M Hoque
(74) *Attorney, Agent, or Firm* — Jeffrey S. La Baw; Michael J. Chang, LLC

(57) ABSTRACT

VTFET devices with bottom source and drain extensions are provided. In one aspect, a method of forming a VTFET device includes: patterning vertical fin channels in a substrate; forming sidewall spacers along the vertical fin channels having a liner and a spacer layer; forming recesses at a base of the vertical fin channels; indenting the liner; annealing the substrate under conditions sufficient to reshape the recesses; forming bottom source and drains in the recesses; forming bottom source and drain extensions in the substrate adjacent to the bottom source and drains; removing the sidewall spacers; forming bottom spacers on the bottom source and drains; forming gate stacks over the bottom spacers alongside the vertical fin channels; forming top spacers over the gate stacks; and forming top source and drains at tops of the vertical fin channels. A VTFET device by the method having bottom source and drain extensions is also provided.

14 Claims, 19 Drawing Sheets

(58) Field of Classification Search
CPC ... H01L 29/16–1608; H01L 29/18–185; H01L 29/22–2206; H01L 29/36–365; H01L 27/11553–11556; H01L 27/1158–11582; H01L 27/11273; H01L 29/66666; H01L 29/7827
USPC ......................................................... 257/329
See application file for complete search history.

(56) References Cited

U.S. PATENT DOCUMENTS

| | | |
|---|---|---|
| 7,683,428 B2 | 3/2010 | Chidambarrao et al. |
| 9,029,974 B2 | 5/2015 | Esteve et al. |
| 10,236,363 B2 | 3/2019 | Xie et al. |
| 10,236,379 B2 | 3/2019 | Bentley et al. |
| 2006/0261406 A1 | 11/2006 | Chen |
| 2017/0229558 A1* | 8/2017 | Anderson ........... H01L 21/3086 |
| 2019/0109214 A1 | 4/2019 | Jeon et al. |

* cited by examiner (continue to FIG. 10)

VERTICAL TRANSPORT FET WITH BOTTOM SOURCE AND DRAIN EXTENSIONS

FIELD OF THE INVENTION

The present invention relates to vertical transport field effect transistor (VTFET) devices, and more particularly, to improved VTFET devices with bottom source and drain extensions.

BACKGROUND OF THE INVENTION

As opposed to planar complementary metal-oxide-semiconductor (CMOS) devices, vertical transport field effect transistors (VTFETs) are oriented with a vertical fin channel disposed on a bottom source and drain. A top source and drain is disposed on the vertical fin channel. VTFETs have been pursued as a potential device option for CMOS scaling that provide notable advantages over other non-planar device designs. For instance, VTFETs have potential advantages over conventional finFETs in terms of density, performance, power consumption, and integration.

With conventional VTFET fabrication processes, the bottom source and drain is typically formed by recessing a substrate at the base of the vertical fin channel, followed by doped bottom source and drain epitaxy. Bottom extensions are then formed by drive-in of dopants from the bottom source and drains.

However, getting a controlled abrupt junction profile is challenging due to the relatively large distance between the doped bottom source and drains and the vertical fin channel. Namely, because of the large bottom source/drain-to-channel distance a higher thermal budget is needed for dopant drive-in to form the extensions. Diffusion with a higher thermal budget ends up with a broad dopant profile. An abrupt junction profile is, however, needed for optimal transistor performance.

Therefore, improved techniques for forming VTFETs with bottom source and drain extensions would be desirable.

SUMMARY OF THE INVENTION

The present invention provides improved vertical transport field effect transistor (VTFET) devices with bottom source and drain extensions. In one aspect of the invention, a method of forming a VTFET device is provided. The method includes: patterning vertical fin channels in a substrate; forming sidewall spacers along opposite sidewalls of the vertical fin channels, wherein the sidewall spacers have a bi-layer configuration including a liner disposed on the vertical fin channels, and a spacer layer disposed over the liner; forming recesses in the substrate at a base of the vertical fin channels; indenting the liner at the base of the vertical fin channels; annealing the substrate under conditions sufficient to reshape the recesses and reduce a width of the base of the vertical fin channels; forming bottom source and drains in the recesses; forming bottom source and drain extensions in the substrate adjacent to the bottom source and drains; removing the sidewall spacers; forming bottom spacers on the bottom source and drains; forming gate stacks over the bottom spacers alongside the vertical fin channels; forming top spacers over the gate stacks; and forming top source and drains at tops of the vertical fin channels.

In another aspect of the invention, a VTFET device is provided. The VTFET device includes: vertical fin channels patterned in a substrate; recesses in the substrate at a base of the vertical fin channels, wherein the vertical fin channels have a width $W_{FIN\ CHANNEL}$ and the base of the vertical fin channels has a width $W"_{FIN\ BASE}$, and wherein $W_{FIN\ CHANNEL} \approx W"_{FIN\ BASE}$; bottom source and drains formed in the recesses; bottom source and drain extensions in the substrate adjacent to the bottom source and drains; bottom spacers disposed on the bottom source and drains; gate stacks over the bottom spacers alongside the vertical fin channels; top spacers disposed over the gate stacks; and top source and drains at tops of the vertical fin channels.

A more complete understanding of the present invention, as well as further features and advantages of the present invention, will be obtained by reference to the following detailed description and drawings.

DETAILED DESCRIPTION OF PREFERRED EMBODIMENTS

As provided above, conventional processes for vertical transport field effect transistor (VTFET) device fabrication rely on high temperature treatments (e.g., from about 950° C. to about 1050° C.) to form the bottom extensions due to the relatively large distance between the bottom source and drains and the channel. Doing so, however, results in a broad dopant profile rather than the abrupt junction desired for optimal performance.

Advantageously, provided herein are techniques for VTFET device fabrication that employ recess modification of the substrate during the bottom source and drain formation that places the bottom source and drains in a closer proximity to the vertical fin channel. That way, the thermal budget for bottom extension formation can be lowered. In turn, a lower thermal budget results in the formation of an abrupt junction profile which improves short channel effects. There is also a reduction in resistance along the lateral direction in the bottom source and drain due to the increased volume of the doped region.

Figure 1:
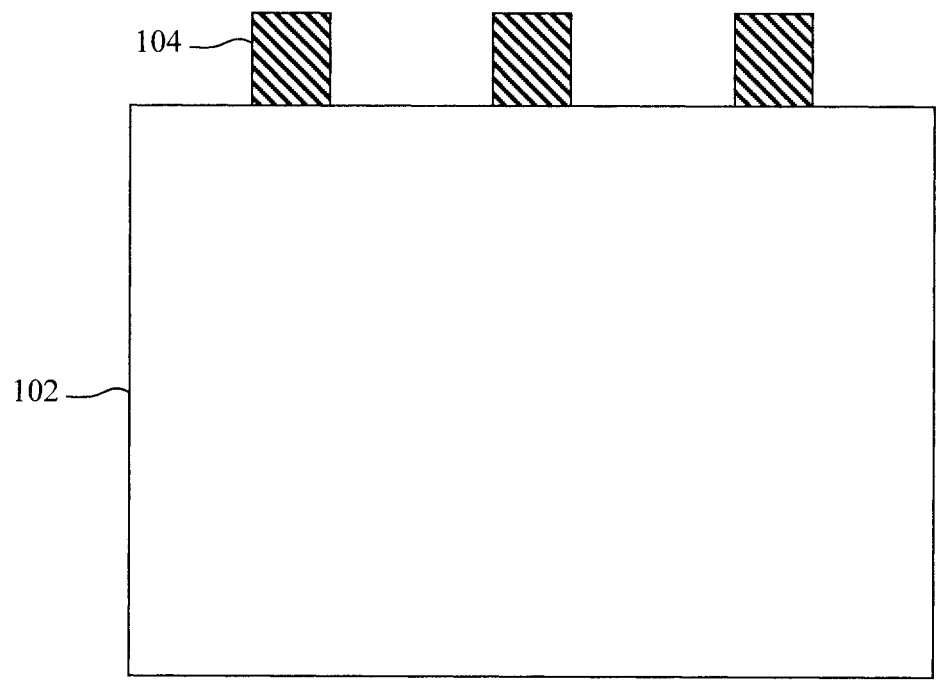
FIG. 1 is a cross-sectional diagram illustrating patterned fin hardmasks having been formed on a substrate according to an embodiment of the present invention.

An exemplary methodology for forming a VTFET device in accordance with the present techniques is now described by way of reference to FIGS. 1-13. As shown in FIG. 1, the process begins with the formation of patterned fin hardmasks 104 on a substrate 102. According to an exemplary embodiment, substrate 102 is a bulk semiconductor wafer, such as a bulk silicon (Si), bulk germanium (Ge), bulk silicon germanium (SiGe) and/or bulk III-V semiconductor wafer. Alternatively, substrate 102 can be a semiconductor-on-insulator (SOI) wafer. A SOI wafer includes a SOI layer separated from an underlying substrate by a buried insulator. When the buried insulator is an oxide it is referred to herein as a buried oxide or BOX. The SOI layer can include any suitable semiconductor, such as Si, Ge, SiGe, and/or a III-V semiconductor. Substrate 102 may already have pre-built structures (not shown) such as transistors, diodes, capacitors, resistors, isolation regions (e.g., shallow trench isolation (STI) regions), interconnects, wiring, etc.

Suitable materials for fin hardmasks 104 include, but are not limited to, nitride hardmask materials such as silicon nitride (SiN), silicon oxynitride (SiON), silicon carbide nitride (SiCN), and/or oxide hardmask materials such as silicon oxide (SiOx). A standard lithography and etching process can be employed to pattern fin hardmasks 104. With standard lithography and etching processes, a lithographic stack (not shown), e.g., photoresist/organic planarizing layer (OPL)/anti-reflective coating (ARC), is used to pattern fin hardmasks 104.

Figure 2:
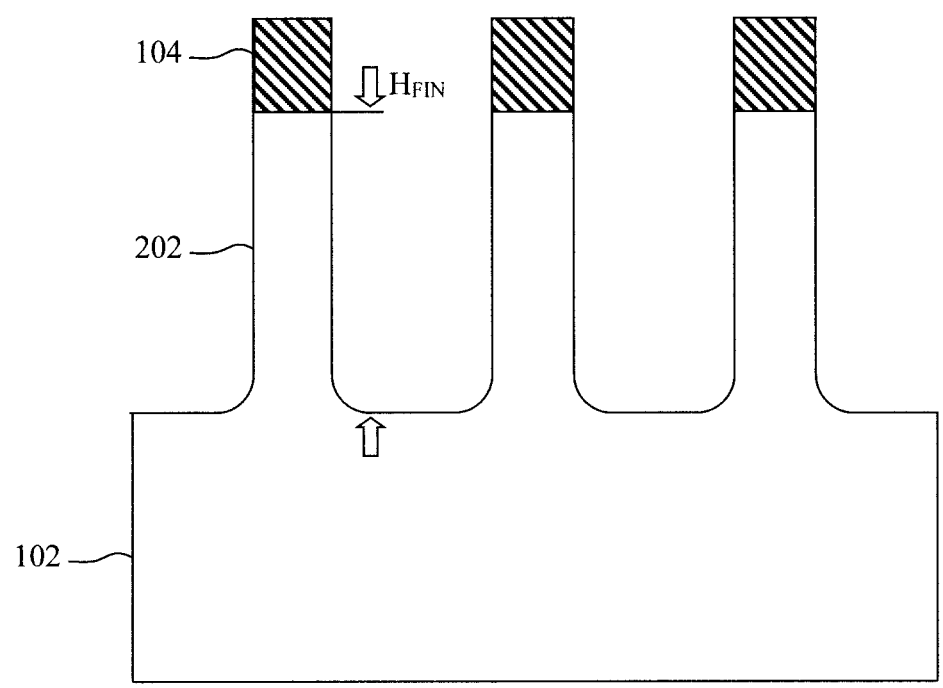
FIG. 2 is a cross-sectional diagram illustrating the fin hardmasks having been used to pattern vertical fin channels in the substrate according to an embodiment of the present invention.
Figure 3:
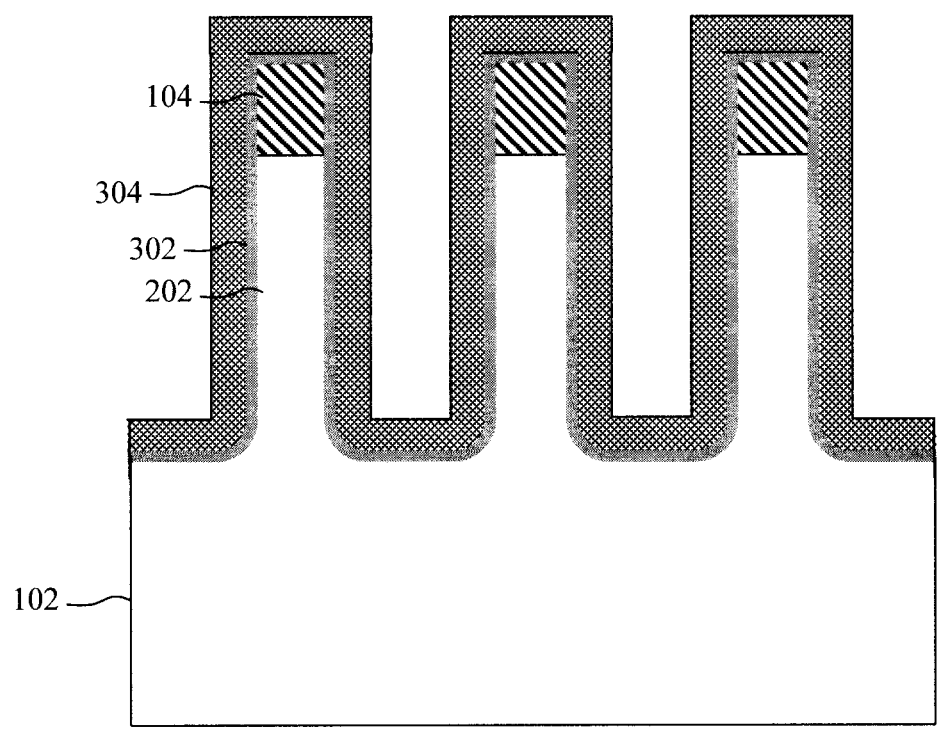
FIG. 3 is a cross-sectional diagram illustrating a conformal liner having been formed on the exposed surfaces of the vertical fin channels and the substrate, and a conformal spacer layer having been deposited over the conformal liner according to an embodiment of the present invention.

The fin hardmasks 104 are then used to pattern vertical fin channels 202 in substrate 102. See FIG. 2. As shown in FIG. 2, as patterned, the vertical fin channels 202 extend partway through the substrate 102. A directional (anisotropic) etching process such as reactive ion etching (RIE) can be employed for the fin etch. It is notable that the depiction of three fins 202 in the figures is merely an example provided to illustrate the present techniques. Embodiments are contemplated herein where more or fewer vertical fin channels 202 than shown are patterned in the substrate 102, including embodiments where a single vertical fin channel 202 is patterned in the substrate 102.

According to an exemplary embodiment, each vertical fin channel 202 has a height $H_{FIN}$ of from about 20 nanometers (nm) to about 50 nm and ranges therebetween. In one exemplary embodiment, substrate 102 is undoped. In that case, vertical fin channels 202 are also undoped.

The next task will be to selectively recess the substrate 102 at the base of the vertical fin channels 202. To do so, sidewall spacers will be formed along opposite sidewalls of the vertical fin channels 202. With the sidewall spacers in place to protect the sidewalls of the vertical fin channels 202, a recess etch will then be used to recess the substrate 102 at the base of the vertical fin channels 202. To form the sidewall spacers, a conformal liner 302 is first formed on the exposed (top and sidewall) surfaces of the vertical fin channels 202 and on the exposed surfaces of substrate 102 in between the vertical fin channels 202. See FIG. 3.

Suitable materials for liner 302 include, but are not limited to, oxide liner materials such as SiOx and/or silicon oxycarbide (SiOC). A process such as chemical vapor deposition (CVD), atomic layer deposition (ALD) or physical vapor deposition (PVD) can be employed to deposit the liner 302 onto the substrate 102/vertical fin channels 202. Alternatively, a process such as thermal oxidation can be used to form the liner 302 on the exposed surfaces of substrate 102/vertical fin channels 202. In that case, the liner 302 may also be referred to herein as a "thermal oxide." According to an exemplary embodiment, liner 302 has a thickness of from about 2 nm to about 5 nm and ranges therebetween.

A conformal spacer layer 304 is then deposited onto the substrate 102/vertical fin channels 202 over the liner 302. See FIG. 3. Suitable materials for spacer layer 304 include, but are not limited to, nitride spacer materials such as SiN, SiON, silicon-boron-carbonitride (SiBCN) and/or SiCN. A process such as CVD, ALD or PVD can be employed to deposit the spacer layer 304 onto the substrate 102/vertical fin channels 202 over the liner 302. According to an exemplary embodiment, spacer layer 304 has a thickness of from about 3 nm to about 15 nm and ranges therebetween.

Figure 4:
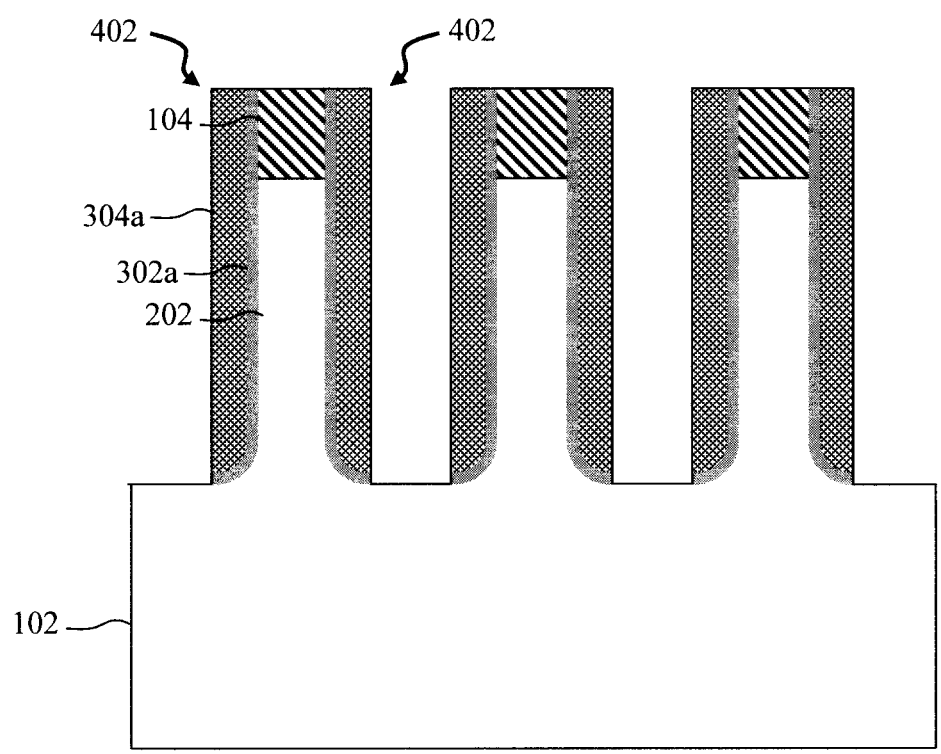
FIG. 4 is a cross-sectional diagram illustrating an etch having been performed to etch back the conformal liner and spacer layer to form sidewall spacers along opposite sidewalls of the vertical fin channels according to an embodiment of the present invention.

An etch is then employed to etch back the liner 302 and spacer layer 304 forming sidewall spacers 402 along the opposite sidewalls of the vertical fin channels 202. See FIG. 4. A directional (anisotropic) etching process such as RIE can be employed for the sidewall spacer 402 etch back. The patterned portions of the liner 302 and spacer layer 304 in sidewall spacers 402 are now given the reference numerals 302a and 304a, respectively. As shown in FIG. 4, the sidewall spacers 402 have a bi-layer configuration with (e.g., oxide) liner 302a disposed along the sidewalls of the vertical fin channels 202, and a (e.g., nitride) spacer layer 304a disposed over the liner 302a. As will be described in detail below, this bi-layer spacer design will be leveraged during the recess modification of the substrate 102 at the base of the vertical fin channels 202, whereby the (e.g., oxide) liner 302a is selectively indented to permit recess reflow below the (e.g., nitride) spacer layer 304a.

Figure 5:
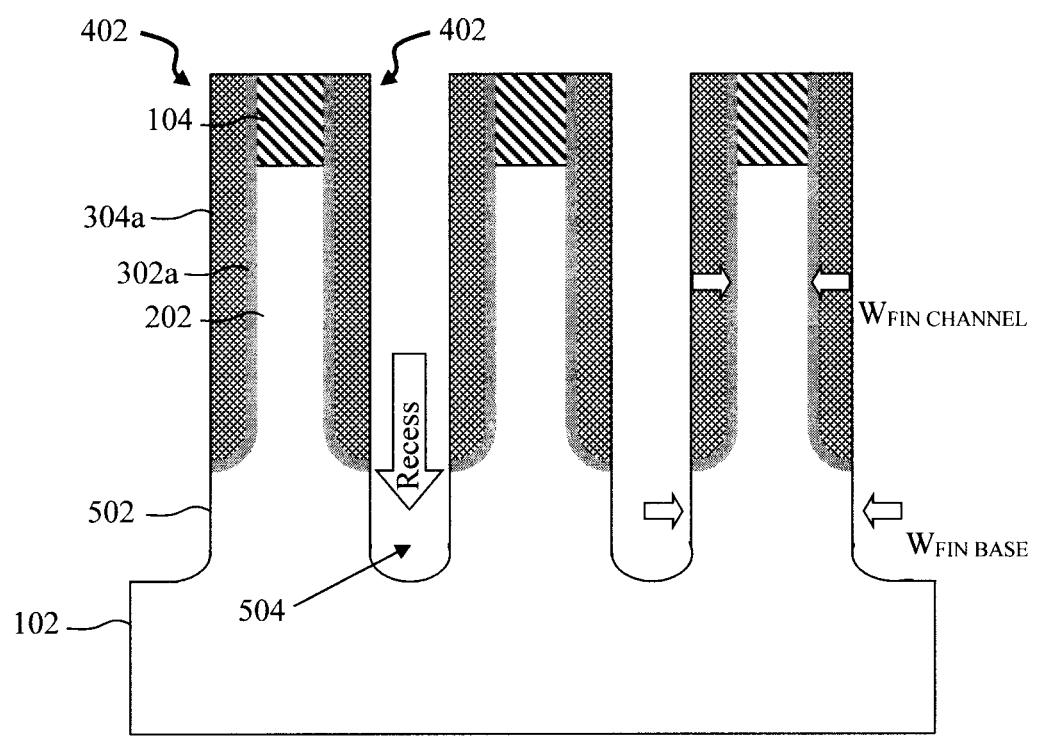
FIG. 5 is a cross-sectional diagram illustrating recesses having been formed in the substrate at a base of the vertical fin channels below the sidewall spacers according to an embodiment of the present invention.

First, however, a recess etch of the substrate 102 is performed at a base 502 of the vertical fin channels 202 to form recesses 504 in substrate 102 at the base of the vertical fin channels 202 below the sidewall spacers 402. See FIG. 5. A directional (anisotropic) etching process such as RIE can be employed for the recess etch of substrate 102. As shown in FIG. 5, since the sidewall spacers 402 are present along the sidewalls of vertical fin channels 202 and cover a portion of the underlying substrate 102, following the recess etch a width at the base 502 of the vertical fin channels 202, i.e., $W_{FIN\ BASE}$, is greater than a width of the vertical fin channels 202, i.e., $W_{FIN\ CHANNEL}$, where $W_{FIN\ BASE} > W_{FIN\ CHANNEL}$. However, steps will be taken below to modify the recess, placing the bottom source and drains in closer proximity to the vertical fin channels 202.

Namely, indentation of the (e.g., oxide) liner 302a is next performed. See FIG. 6. Indentation of the (e.g., oxide) liner 302a permits reflow of the recess to be performed at the base 502 of the vertical fin channels 202 thereby modifying the shape of the recesses 504 to bring the bottom source and drains in closer proximity to the vertical fin channels 202. This process of indentation of the (e.g., oxide) liner 302a followed by reflow can be repeated for multiple iterations until the desired shape of the recesses 504 is achieved, after which epitaxial bottom source and drains are deposited/grown in the recesses 504 at the base 502 of the vertical fin channels 202.

According to an exemplary embodiment, this process of liner indentation, reflow and bottom source and drain epitaxy steps are performed using a common tool or platform such as a cluster tool having multiple processing chambers for integrated circuit fabrication. An exemplary cluster tool is described in conjunction with the description of FIG. 19, below. In general however, the tool has a plurality of processing chambers that includes at least one preclean oxide removal chamber, and at least one epitaxy chamber. In the preclean oxide removal chamber a process such as the SiConi™ preclean process by Applied Materials is used to indent the (e.g., oxide) liner 302a. The sample is then transferred to the epitaxy chamber where a hydrogen (H$_2$) anneal is performed to reflow the exposed recess at the base 502 of the vertical fin channels 202 to reduce the width of the base 502, thus effectively bringing the bottom source and drains closer to the vertical fin channels 202. As provided above, indentation of liner 302a is needed to enable proper reflow of the underlying substrate material at the base 502 of the vertical fin channels 202. This process can then be repeated until the desired shaped recess is achieved. For example, the sample is transferred to a preclean oxide removal chamber for indentation of the (e.g., oxide) liner 302a. The sample is then transferred to an epitaxy chamber for H$_2$ anneal and recess reflow, and so on.

Figure 6:
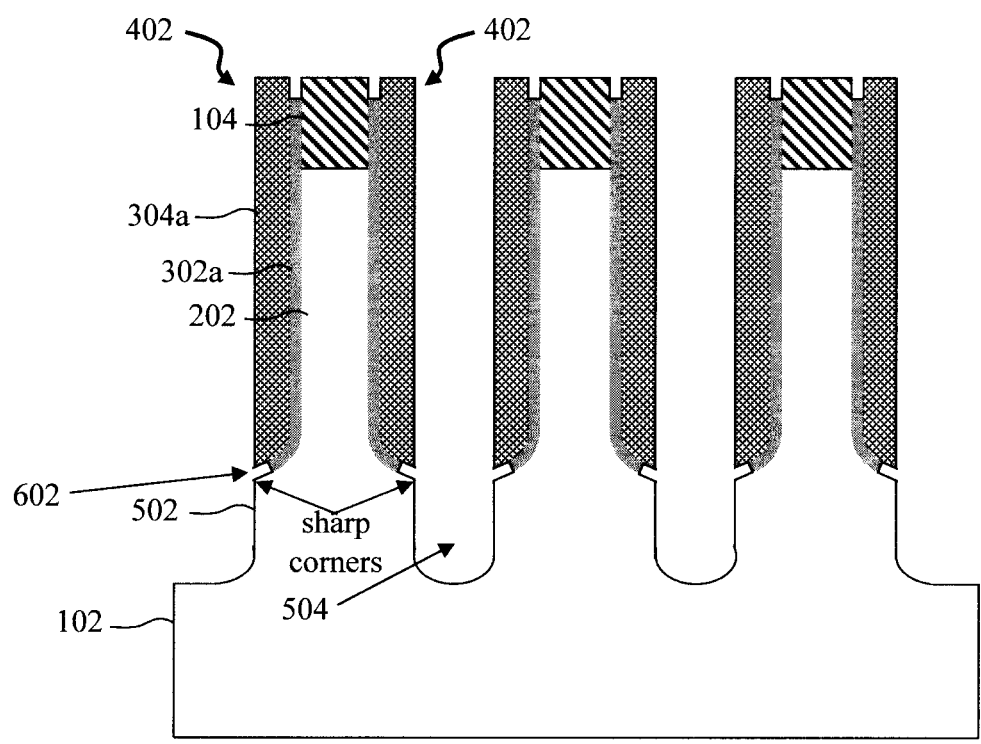
FIG. 6 is a cross-sectional diagram illustrating indentation of the liner having been performed at the base of the vertical fin channels according to an embodiment of the present invention.

As shown in FIG. 6, indentations 602 are now present in the liner 302a at the base 502 of the vertical fin channels 202. As shown in FIG. 6, indentations will also be present at the tops of the vertical fin channels 202 adjacent to the fin hardmasks 104. However, the fin hardmasks 104 should be tall enough so that the vertical fin channels 202 sidewall does not get exposed. As provided above, a preclean oxide removal process such as SiConi™ can be employed to indent the (e.g., oxide) liner 302a. As also provided above, the preclean oxide removal process can be performed in the preclean oxide removal chamber of a cluster tool. This preclean process will remove a portion of the exposed liner 302a from in between the (e.g., nitride) spacer layer 304a and the base 502 of the vertical fin channels 202. Recess reflow will next be performed, which exposes more of the liner 302a enabling another indentation of the liner 302a to be performed if so desired. Thus, the liner 302a indentations can be formed incrementally.

Indentation of the liner 302a is needed to reflow the base 502 of the vertical fin channels 202. Namely, during reflow atoms diffuse along the surface causing sharp features such as corners to become rounded and smooth. This reshaping principle is leveraged here to reduce the width of the base 502 of the vertical fin channels 202. By indenting the liner 302a, sharp corners of the base 502 are exposed. See FIG. 6. These corners are then rounded during the reflow anneal (see below), effectively reducing the width of the base 502. The process can then be repeated for further width reduction.

Figure 7:
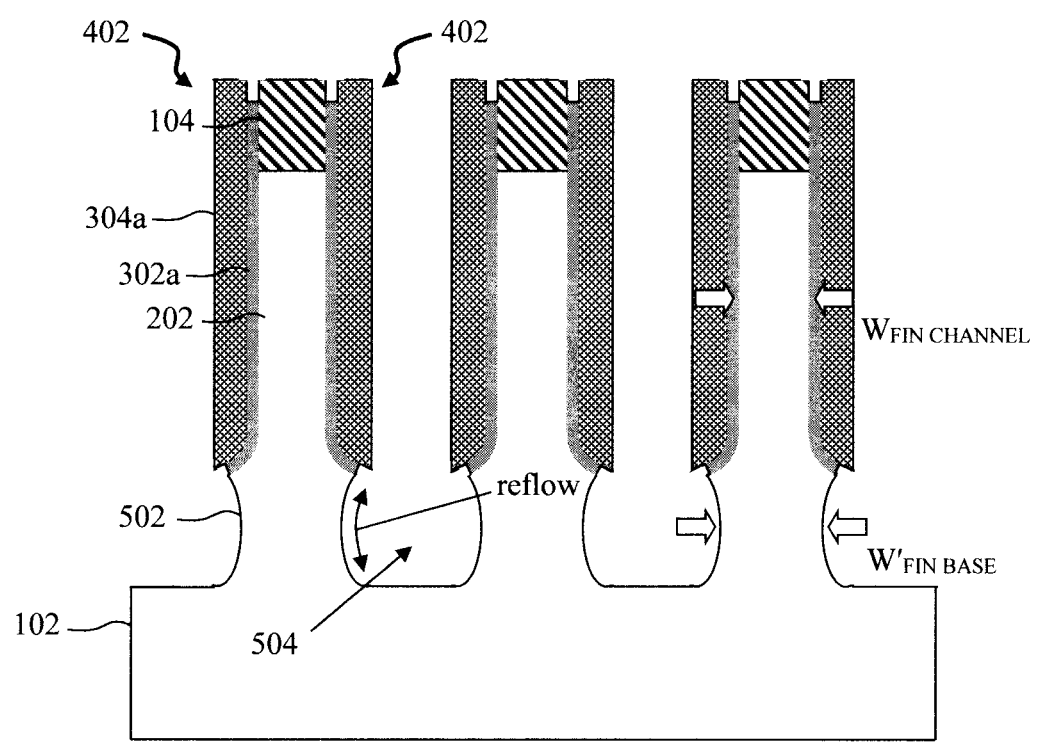
FIG. 7 is a cross-sectional diagram illustrating the substrate and vertical fin channels having been annealed under conditions sufficient to reflow/reshape the recesses according to an embodiment of the present invention.

Namely, as shown in FIG. 7 the substrate 102 and vertical fin channels 202 are annealed under conditions sufficient to reflow the recesses 504. As provided above, this anneal can be performed in the epitaxy chamber of a cluster tool. According to an exemplary embodiment, the conditions include, but are not limited to, a temperature of from about 600° C. to about 1000° C. and ranges therebetween, and a duration of from about 1 minute to about 10 minutes and ranges therebetween. Preferably, the reflow anneal is performed in a hydrogen (H$_2$)-containing ambient at a pressure of from about 5 Torr to about 600 Torr and ranges therebetween.

As shown in FIG. 7, this recess reflow reduces the width of the base 502. Namely, following the initial recess etch, the base 502 of the vertical fin channels 202 had a width $W_{FIN\ BASE}$ (see FIG. 5—described above) which is now reduced to $W'_{FIN\ BASE}$, where $W'_{FIN\ BASE} < W_{FIN\ BASE}$. Further, reducing the width of base 502 brings the dimensions of base 502 closer to that of the vertical fin channels 202, i.e., $W_{FIN\ CHANNEL} < W'_{FIN\ BASE} < W_{FIN\ BASE}$. The goal is to reduce the width of base 502 until it approximates the width of the vertical fin channels 202. Thus, if further reduction of the width of base 502 is needed, the liner indentation and recess reflow processes can be repeated one or more times.

Figure 8:
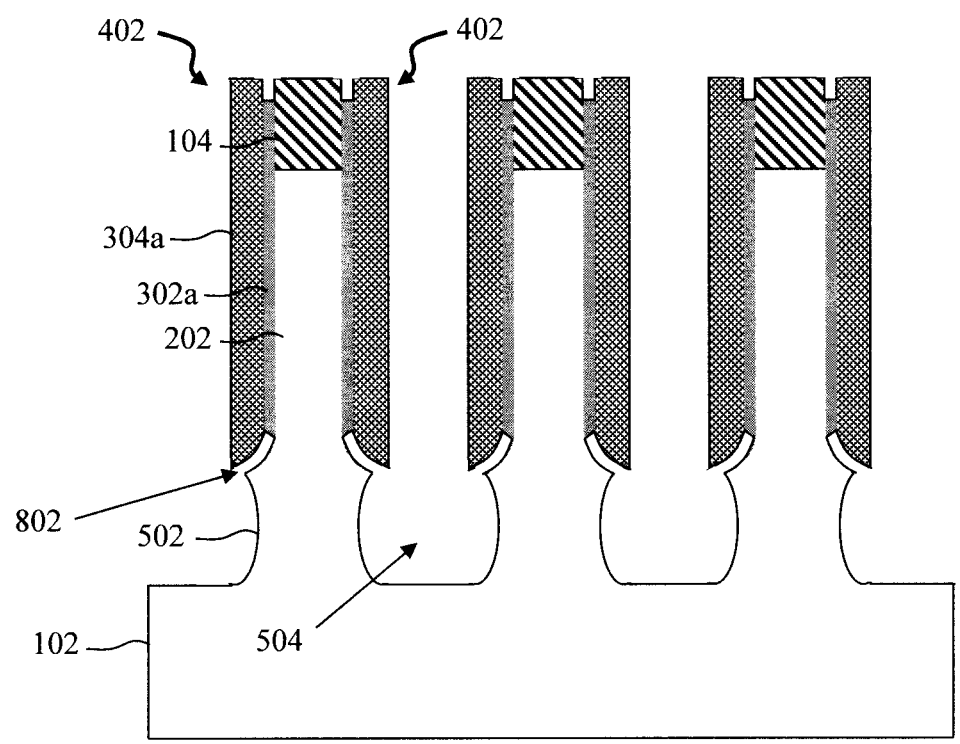
FIG. 8 is a cross-sectional diagram illustrating another (optional) indentation of the liner having been performed at the base of the vertical fin channels according to an embodiment of the present invention.

Namely, another indentation of the (e.g., oxide) liner 302a at the base 502 of the vertical fin channels 202 is next optionally performed. See FIG. 8. As provided above, indentation of liner 302a is needed to enable proper reflow of the underlying substrate material at the base 502 of the vertical fin channels 202. As shown in FIG. 8, indentations 802 are now present in the liner 302a at the base 502 of the vertical fin channels 202. As provided above, a preclean oxide removal process such as SiConi™ can be employed to indent the (e.g., oxide) liner 302a performed, for example, in the preclean oxide removal chamber of a cluster tool. This preclean process will remove a portion of the exposed liner 302a from in between the (e.g., nitride) spacer layer 304a and the base 502 of the vertical fin channels 202.

Figure 9:
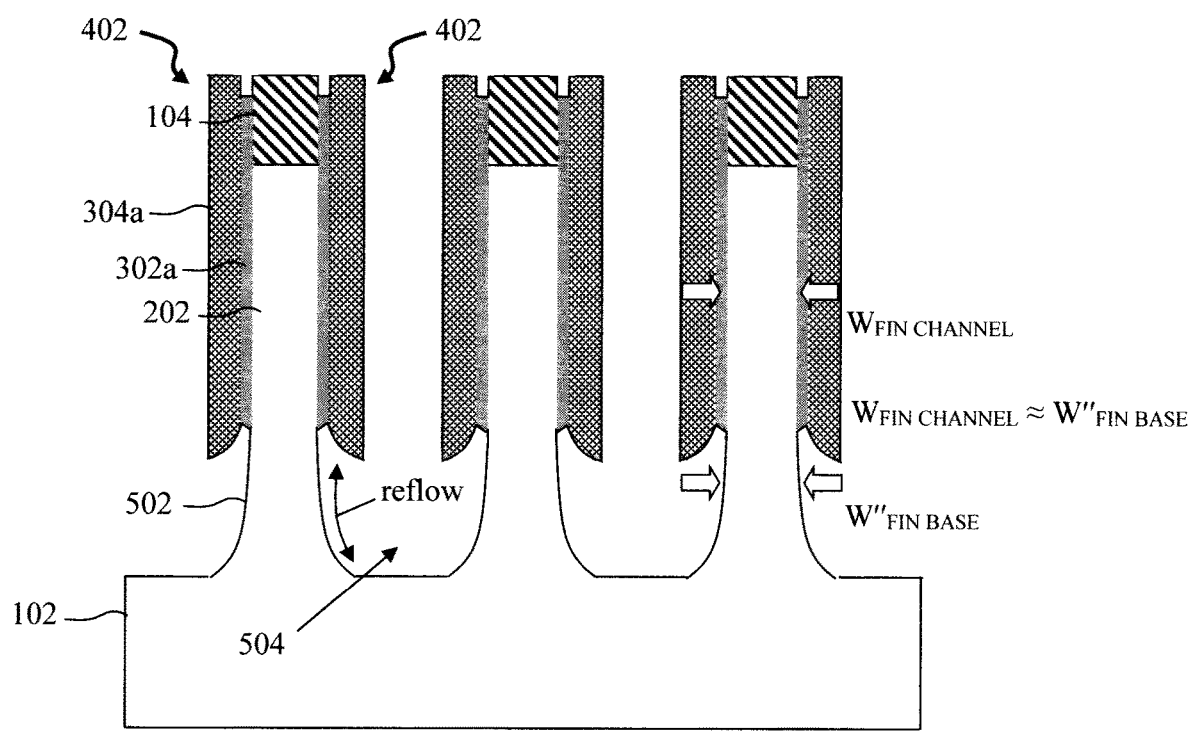
FIG. 9 is a cross-sectional diagram illustrating the substrate and vertical fin channels having been annealed under conditions sufficient to reflow/reshape the recesses according to an embodiment of the present invention.
Figure 10:
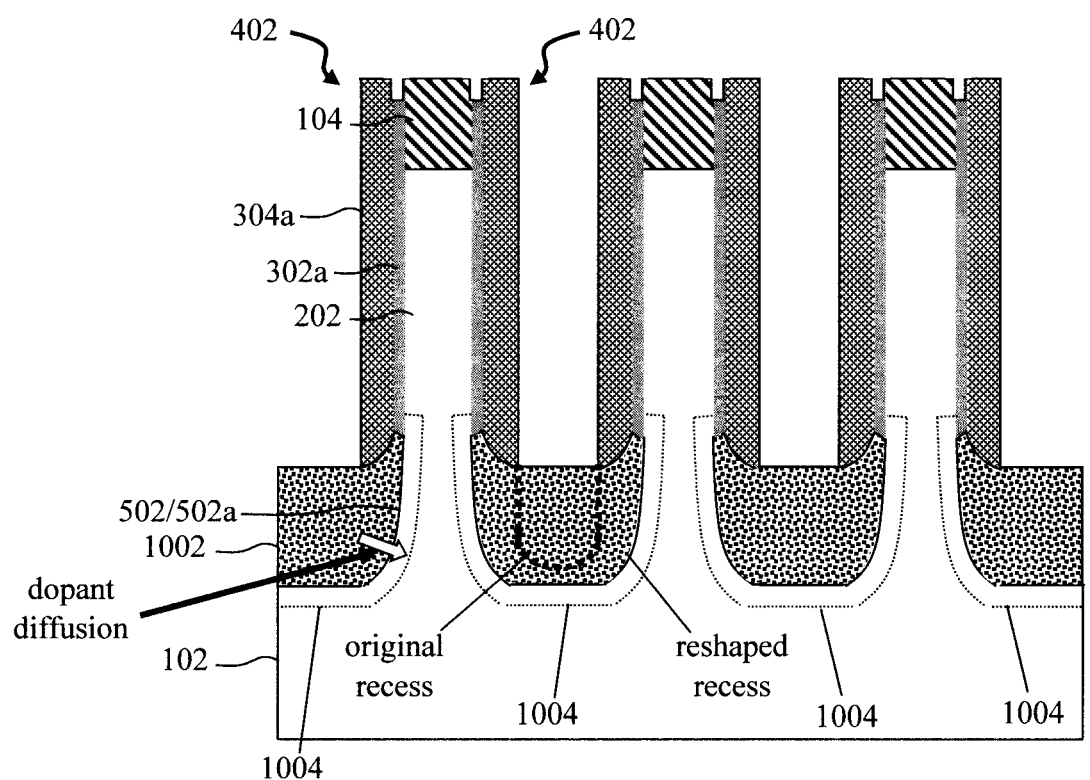
FIG. 10 is a cross-sectional diagram illustrating bottom source and drains having been formed in the recesses according to an embodiment of the present invention.
Figure 11:
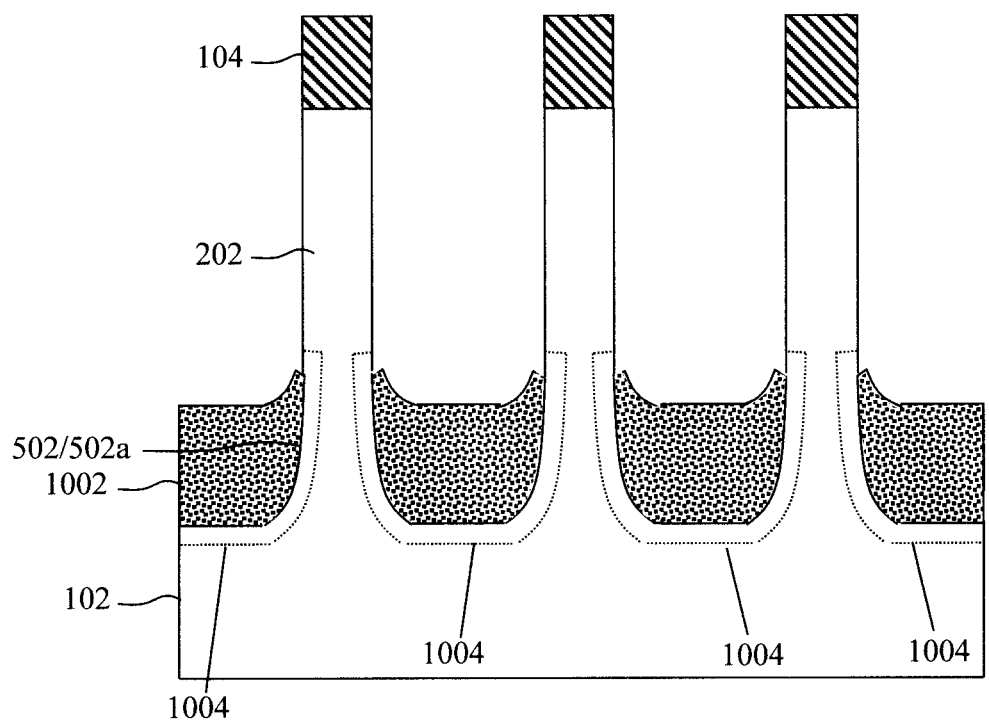
FIG. 11 is a cross-sectional diagram illustrating the sidewall spacers having been removed from the sidewalls of vertical fin channels according to an embodiment of the present invention.

Next, as shown in FIG. 9 the substrate 102 and vertical fin channels 202 are annealed under conditions sufficient to reflow the recesses 504. As provided above, this anneal can be performed in the epitaxy chamber of a cluster tool. According to an exemplary embodiment, the conditions include, but are not limited to, a temperature of from about 600° C. to about 1000° C. and ranges therebetween, and a duration of from about 1 minute to about 10 minutes and ranges therebetween. Preferably, the reflow anneal is performed in an Hz-containing ambient at a pressure of from about 5 Torr to about 600 Torr and ranges therebetween.

As shown in FIG. 9, this recess reflow further reduces the width of the base 502, i.e., from $W'_{FIN\ BASE}$ to $W''_{FIN\ BASE}$, where $W''_{FIN\ BASE} < W'_{FIN\ BASE}$. As further shown in FIG. 9, reducing the width of base 502 makes the dimensions of base 502 approximate that of the vertical fin channels 202, i.e., $W_{FIN\ CHANNEL} \approx W''_{FIN\ BASE}$. For instance, according to an exemplary embodiment, $W''_{FIN\ BASE} - W_{FIN\ CHANNEL} = x$, wherein x is less than or equal to about 3 nm, e.g., from about 0 nm to about 3 nm and ranges therebetween. However, if further reductions in the width of base 502 are needed, one or more further iterations of the liner indentation and recess reflow processes can be performed.

Bottom source and drains 1002 are then formed in the recesses 504. See FIG. 10. In FIGS. 10-13 the base of the vertical fin channels 202 is referred to as 502/502a merely to indicate that the same steps illustrated in FIGS. 10-13 also apply to an alternative embodiment described below where, for clarification, the base of the vertical fin channels 202 is given the reference numeral 502a. According to an exemplary embodiment, bottom source and drains 1002 are formed from an in-situ doped (e.g., during growth) or ex-situ doped (e.g., via ion implantation) epitaxial material such as epitaxial Si, epitaxial Ge and/or epitaxial SiGe. Suitable n-type dopants include, but are not limited to, phosphorous (P) and/or arsenic (As). Suitable p-type dopants include, but are not limited to, boron (B). As provided above, this anneal can be performed in the epitaxy chamber of a cluster tool.

Advantageously, use of the present reflow process to reshape the recesses 504 and thereby reduce the width at the base 502 of the vertical fin channels 202 results in the bottom source and drains 1002 formed in recesses 504 being physically closer to the vertical fin channels 202. To illustrate this concept, for illustrative purposes only, dashed lines are provided in FIG. 10 to depict the shape of the original recesses. As can be clearly seen in FIG. 10, the reshaped recesses place the bottom source and drains 1002 closer to the vertical fin channels 202. Thus, a lower thermal budget is needed to form bottom source and drain extensions. Namely, following formation of the bottom source and drains 1002, an anneal is performed to form bottom source and drain extensions 1004 using dopant diffusion into the substrate 102 from the bottom source and drains 1002. See bottom source and drain extensions in substrate 102 adjacent to the bottom source and drains 1002 in FIG. 10. According to an exemplary embodiment, the anneal to form the bottom source and drain extensions 1004 is performed at a temperature of less than about 1000° C., e.g., from about 850° C. to about 990° C. and ranges therebetween depending on the diffusivity of the dopants. As will be described in detail below, the dopant needs to diffuse a certain distance into the substrate 102 in order to overlap with the gate. Advantageously, with the present device, the dopant needs to diffuse a shorter distance than with conventional device designs, which means a lower thermal budget (e.g., less than about 1000° C.—see above) is needed to form the bottom source and drain extensions. Due to a lower thermal budget, the dopant profile at the bottom source and drain extensions is more abrupt as compared to the dopant profile that would be achieved using a higher thermal budget.

The sidewall spacers 402 (i.e., liner 302a and spacer layer 304a) are then removed from the sidewalls of vertical fin channels 202. See FIG. 11. A non-directional (i.e., isotropic) etching process such as a wet chemical etch can be used to remove the sidewall spacers 402. Removal of sidewall spacers 402 enables the formation of gate stacks alongside the vertical fin channels 202.

Prior to forming the gate stacks, bottom spacers 1202 are formed on the bottom source and drains 1002. See FIG. 12. Suitable materials for the bottom spacers 1202 include, but are not limited to, oxide spacer materials such as SiOx and/or SiOC and/or nitride spacer materials such as SiN, SiBCN and/or silicon-boron-nitride (SiBN).

According to an exemplary embodiment, the bottom spacers 1202 are formed using a directional deposition process whereby the spacer material is deposited onto the bottom source and drains 1002 and vertical fin channels 202 with a greater amount of the spacer material being deposited on horizontal surfaces (including on top of the bottom source and drains 1002 in between the vertical fin channels 202), as compared to vertical surfaces (such as along sidewalls of vertical fin channels 202). Thus, when an etch is used on the spacer material, the timing of the etch needed to remove the spacer material from the vertical surfaces will leave the bottom spacers 1202 shown in FIG. 12 disposed on the bottom source and drains 1002 since a greater amount of the spacer material was deposited on the bottom source and drains 1002. By way of example only, a high-density plasma (HDP) CVD or PVD process can be used for directional film deposition, and an oxide- or nitride-selective (depending on the spacer material) isotropic etch can be used to remove the (thinner) spacer material deposited onto the vertical surfaces.

The gate stacks are then formed alongside the vertical fin channels 202 over the bottom spacers 1202, whereby the bottom spacers 1202 serve to offset the gate stacks from the bottom source and drains 1002. To form the gate stacks, an interfacial oxide 1204 (such as SiOx which may include other chemical elements in it such as nitrogen, germanium, etc.) is first formed selectively on exposed surfaces of the vertical fin channels 202 by an oxidation process to a thickness of from about 0.3 nm to about 5 nm and ranges therebetween, e.g., about 1 nm.

A conformal gate dielectric 1206 is deposited onto the vertical fin channels 202 over the interfacial oxide 1204 and over the bottom spacers 1202. A process such as CVD, ALD or PVD can be employed to deposit the gate dielectric 1206. According to an exemplary embodiment, the gate dielectric 1206 has a thickness of from about 1 nm to about 5 nm and ranges therebetween. In one exemplary embodiment, a metal gate stack is formed where the gate dielectric 1206 is a high-κ dielectric. The term "high-κ," as used herein, refers to a material having a relative dielectric constant κ which is much higher than that of silicon dioxide ($SiO_2$), e.g., a dielectric constant κ=25 for hafnium oxide ($HfO_2$) rather than 4 for $SiO_2$). Suitable high-κ gate dielectrics include, but are not limited to, $HfO_2$ and/or lanthanum oxide ($La_2O_3$).

For the metal gate stack, a conformal workfunction-setting metal 1208 is then deposited onto the gate dielectric 1206. A process such as CVD, ALD, PVD, evaporation or sputtering can be employed to deposit the workfunction-setting metal 1208. According to an exemplary embodiment, the workfunction-setting metal 1208 has a thickness of from about 1 nm to about 10 nm and ranges therebetween. The particular workfunction-setting metal 1208 employed can vary depending on whether an n-type or p-type VTFET is desired. By way of example only, suitable n-type workfunction-setting metals include, but are not limited to, titanium nitride (TiN), tantalum nitride (TaN) and/or aluminum (Al)-containing alloys such as titanium aluminide (TiAl), titanium aluminum nitride (TiAlN), titanium aluminum carbide (TiAlC), tantalum aluminide (TaAl), tantalum aluminum nitride (TaAlN), and/or tantalum aluminum carbide (TaAlC). Suitable p-type workfunction-setting metals include, but are not limited to, TiN, TaN, and tungsten (W). TiN and TaN are relatively thick (e.g., greater than about 2 nm) when used as p-type workfunction metals. However, very thin TiN or TaN layers (e.g., less than about 2 nm) may also be used beneath Al-containing alloys in n-type workfunction stacks to improve electrical properties such as gate leakage currents. Thus, there is some overlap in the exemplary n-type and p-type workfunction-setting metals given above.

Figure 12:
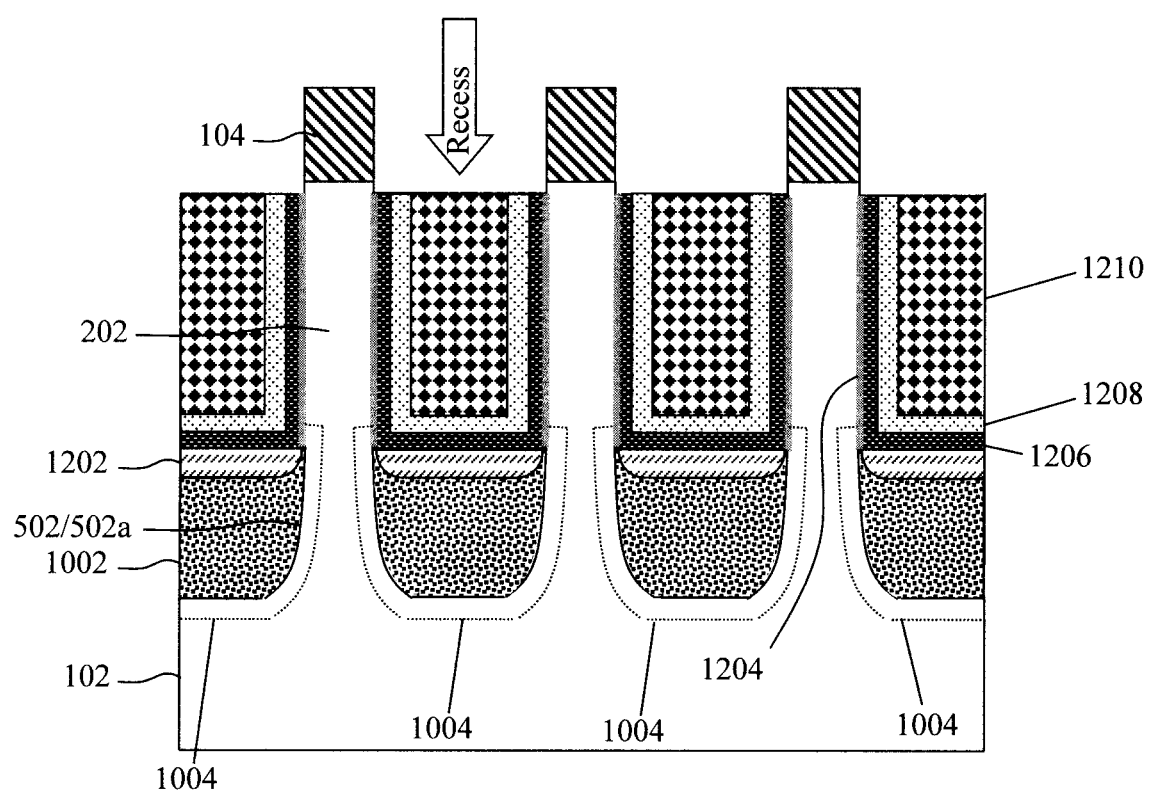
FIG. 12 is a cross-sectional diagram illustrating bottom spacers having been formed on the bottom source and drains, and gate stacks having been formed alongside the vertical fin channels over the bottom spacers according to an embodiment of the present invention.
Figure 13:
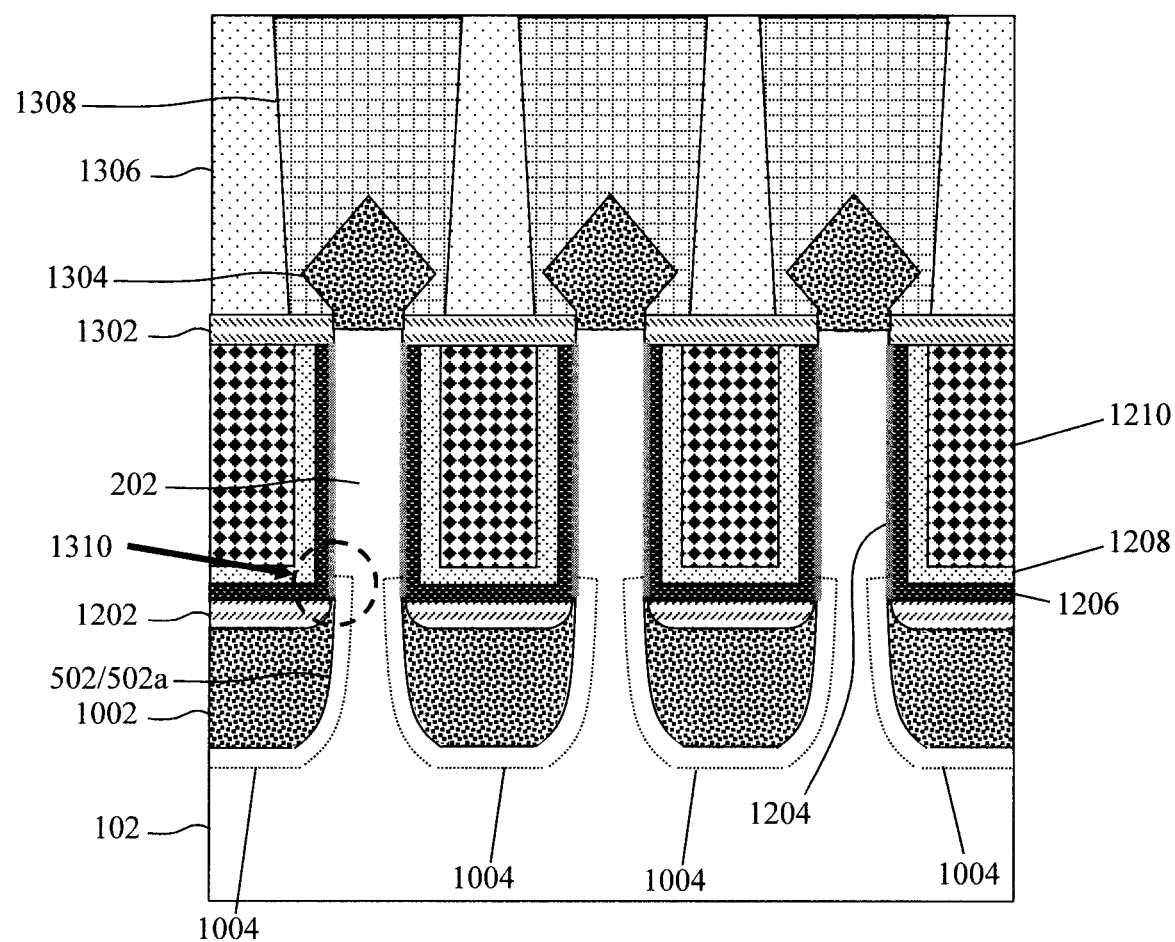
FIG. 13 is a cross-sectional diagram illustrating top spacers having been formed on the gate stacks, the fin hardmasks having been removed, top source and drains having been formed at the tops of the vertical fin channels, an interlayer dielectric (ILD) having been deposited over the vertical fin channels, and contacts having been formed in the ILD over the top source and drains according to an embodiment of the present invention.
Figure 14:
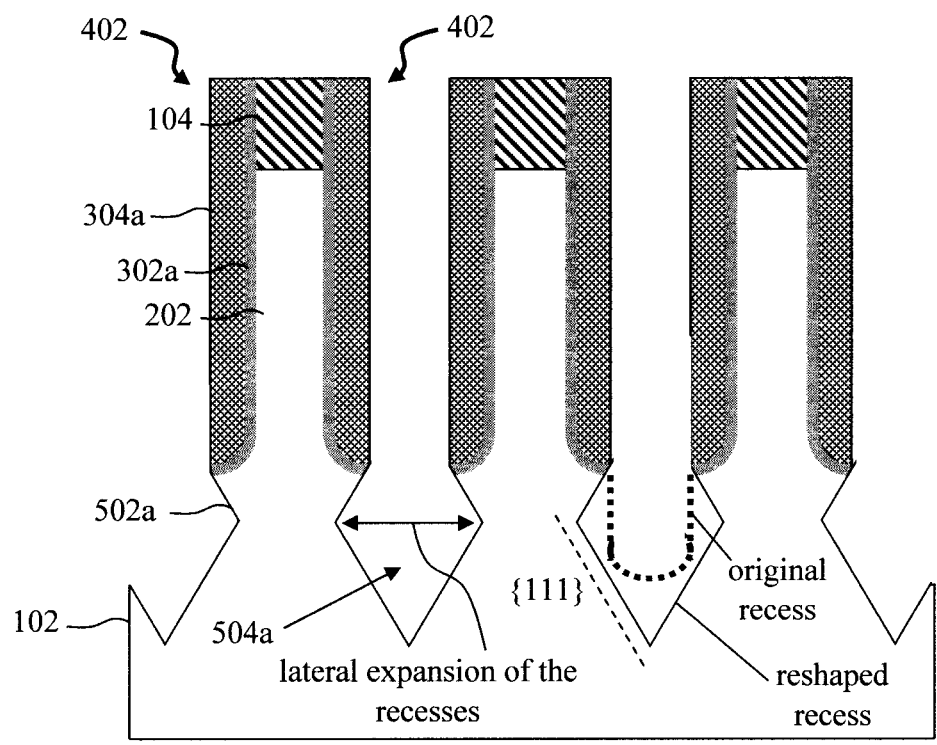
FIG. 14 is a cross-sectional diagram which follows from FIG. 5 illustrating, according to an alternative embodiment, a lateral etch having been performed to (laterally) expand the recesses at the base of the vertical fin channels according to an embodiment of the present invention.

Finally, a low-resistance contact metal 1210 is deposited onto the workfunction-setting metal 1208, filling the gaps between vertical fin channels 202. Suitable low-resistance contact metals 1210 include, but are not limited to, tungsten (W), cobalt (Co) and/or ruthenium (Ru). A process such as CVD, ALD, PVD, evaporation or sputtering can be employed to deposit the low-resistance contact metal 1210. As shown in FIG. 12, the as-formed/as-deposited interfacial oxide 1204, gate dielectric 1206, workfunction-setting metal 1208 and low-resistance contact metal 1210 is then recessed below the tops of the vertical fin channels 202.

Top spacers 1302 are then formed on the gate stacks. See FIG. 13. Suitable materials for the top spacers 1302 include, but are not limited to, oxide spacer materials such as SiOx and/or SiOC and/or nitride spacer materials such as SiN, SiBCN and/or SiBN. Top spacers 1302 can be formed from the same material(s) as bottom spacers 1202. However, that is not a requirement, and embodiments are contemplated herein where the bottom spacers 1202 and top spacers 1302 are formed from different materials. As with bottom spacers 1202, the top spacers 1302 can be formed using a directional deposition process (such as an HDP CVD or PVD process) followed by an etch to remove the (thinner) spacer material from the vertical surfaces.

Following formation of the top spacers 1302, the fin hardmasks 104 are removed, and top source and drains 1304 are formed at the tops of the vertical fin channels 202. According to an exemplary embodiment, the top source and drains 1304 are formed from in-situ or ex-situ doped epitaxial Si, epitaxial Ge and/or epitaxial SiGe. As provided above, suitable n-type dopants include, but are not limited to, phosphorous (P) and/or arsenic (As), and suitable p-type dopants include, but are not limited to, boron (B). The top spacers 1302 serve to offset the top source and drains 1304 from the gate stacks.

The vertical fin channels 202, bottom source and drains 1002, bottom spacers 1202, gate stacks, top spacers 1302 and top source and drains 1304 are then buried in an interlayer dielectric (ILD) 1306. Suitable materials for ILD 1306 include, but are not limited to, oxide low-K materials such as SiOx and/or oxide ultralow-K interlayer dielectric (ULK-ILD) materials, e.g., having a dielectric constant γ of less than 2.7. By comparison, silicon dioxide ($SiO_2$) has a dielectric constant K value of 3.9. Suitable ultralow-K dielectric materials include, but are not limited to, porous organosilicate glass (pSiCOH). A process such as CVD, ALD, or PVD can be employed to deposit the ILD 1306. Following deposition, the ILD 1306 can be planarized using a process such as chemical-mechanical polishing (CMP).

Contacts 1308 are then formed in the ILD 1306 over, and contacting, the top source and drains 1304. See FIG. 13. Standard metallization processes can be employed to form contacts 1308. For instance, by way of example only, trenches (e.g., vias and/or trenches) can be patterned in ILD 1306 over the top source and drains 1304. The features are then filled with a metal(s) to form contacts 1308. Any metal overburden can be removed using a process such as CMP. Suitable contact metals include, but are not limited to, copper (Cu), Co and/or Ru.

As described above, dopant diffusion from the bottom source and drains 1002 is used to form the bottom source and drain extensions 1004. To do so, the dopant needs to diffuse a certain distance into the substrate 102 in order to overlap with the gate. See overlap area between the bottom source and drain extensions 1004 and the gate stacks highlighted by dashed circle 1310. Advantageously, with the present device, the dopant needs to diffuse a shorter distance than with conventional device designs, which means a lower thermal budget (e.g., less than about 1000° C.—see above) is needed to form the bottom source and drain extensions. Due to a lower thermal budget, the dopant profile at the bottom source and drain extensions is more abrupt as compared to the dopant profile that would be achieved using a higher thermal budget.

The recess reshaping process just described can also include an optional lateral expansion of the recess prior to indentation and recess reflow. Namely, as described above, a goal of the present techniques is to reduce the width of the base of the vertical fin channels. Employing an initial etch to expand the recesses laterally facilitates the recess reflow and reshaping process by reducing the amount of substrate material that needs to be diffused during the reflow. An exemplary alternative methodology for forming a VTFET device that employs this initial lateral expansion of the recesses is now described by way of reference to FIGS. 14-18. This alternative process flow begins in exactly the same manner as described in conjunction with the description of FIGS. 1-5 above with the patterning of vertical fin channels 202 in substrate 102, forming the bi-layer sidewall spacers 402 having the (e.g., oxide) liner 302a disposed along the sidewalls of the vertical fin channels 202 and the (e.g., nitride) spacer layer 304a disposed over the liner 302a, and forming recesses 504 in the substrate 102 at the base of the vertical fin channels 202. As such like structures are numbered alike in the figures. Further, as will be described in detail below, the steps performed at the end of the process to complete the device are also the same as described above.

However, following from FIG. 5, prior to indentation of the (e.g., oxide) liner 302a and reflow of the recesses a lateral etch is performed to (laterally) expand the recesses at the base of the vertical fin channels 202. See FIG. 14. For clarity of description, the base and the recesses are given the reference numerals 502a and 504a, respectively. According to an exemplary embodiment, this lateral etch is performed using a wet chemical etchant such as hydrochloric acid (HCl), potassium hydroxide (KOH), ammonium hydroxide ($NH_4OH$), and Tetra Methyl Ammonium Hydroxide (TMAH) or gas phase etching of Si with HCl. It is known that etchants such as HCl can form {111} facets due to plane orientation anisotropy of etching rate. For illustrative purposes only, dashed lines are provided in FIG. 14 to depict the shape of the original recesses for comparison to the recesses following the lateral etch. This lateral etching of the recesses can be performed in the epitaxy chamber of a cluster tool. Following the lateral etch, the sidewalls of recesses 504a now have a sigma (E) shaped profile.

Figure 15:
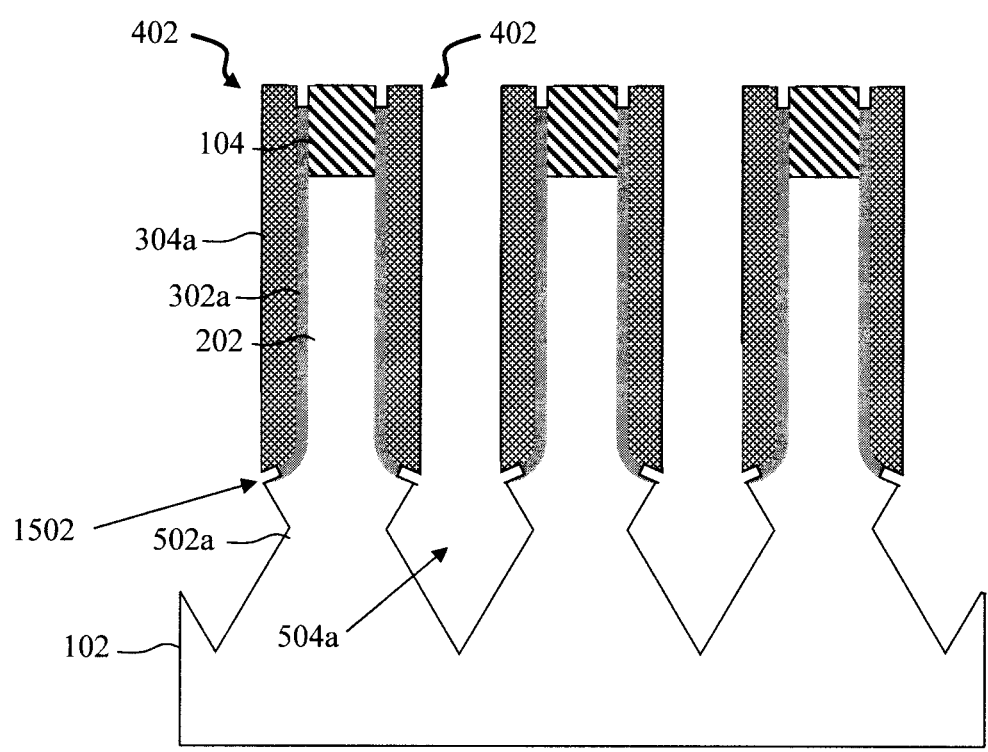
FIG. 15 is a cross-sectional diagram illustrating an indentation of the liner having been performed at the base of the vertical fin channels according to an embodiment of the present invention.

An indentation of the (e.g., oxide) liner 302a at the base 502a of the vertical fin channels 202 is next performed. See FIG. 15. As provided above, indentation of liner 302a is needed to enable proper reflow of the underlying substrate material at the base 502a of the vertical fin channels 202. As shown in FIG. 15, indentations 1502 are now present in the liner 302a at the base 502a of the vertical fin channels 202. As shown in FIG. 15, indentations will also be present at the tops of the vertical fin channels 202 adjacent to the fin hardmasks 104. However, the fin hardmasks 104 should be tall enough so that the vertical fin channels 202 sidewall does not get exposed. As provided above, a preclean oxide removal process such as SiConi™ can be employed to indent the (e.g., oxide) liner 302a performed, for example, in the preclean oxide removal chamber of a cluster tool. This preclean process will remove a portion of the exposed liner 302a from in between the (e.g., nitride) spacer layer 304a and the base 502a of the vertical fin channels 202.

Figure 16:
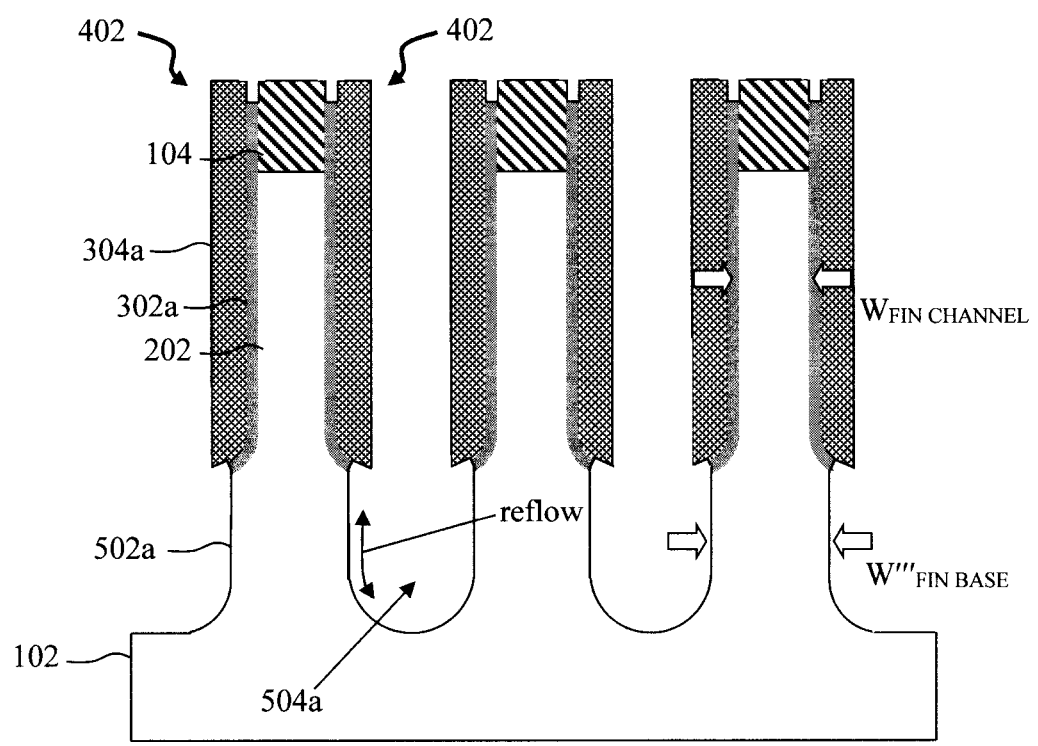
FIG. 16 is a cross-sectional diagram illustrating the substrate and vertical fin channels having been annealed under conditions sufficient to reflow/reshape the recesses according to an embodiment of the present invention.

Next, as shown in FIG. 16 the substrate 102 and vertical fin channels 202 are annealed under conditions sufficient to reflow the recesses 504a. As provided above, this anneal can be performed in the epitaxy chamber of a cluster tool. According to an exemplary embodiment, the conditions include, but are not limited to, a temperature of from about 600° C. to about 1000° C. and ranges therebetween, and a duration of from about 1 minute to about 10 minutes and ranges therebetween. Preferably, the reflow anneal is performed in an 112-containing ambient at a pressure of from about 5 Torr to about 600 Torr and ranges therebetween.

As shown in FIG. 16, this recess reflow reduces the width of the base 502a. Namely, following the initial recess etch, the base of the vertical fin channels 202 had a width $W_{FIN\ BASE}$ (see FIG. 5—described above) which is now reduced to $W'''_{FIN\ BASE}$, where $W'''_{FIN\ BASE} < W_{FIN\ BASE}$. As described above, reducing the width of base 502a brings the dimensions of base 502a closer to that of the vertical fin channels 202, i.e., $W_{FIN\ CHANNEL} < W'''_{FIN\ BASE} < W_{FIN\ BASE}$, and the goal is to reduce the width of base 502a until it approximates the width of the vertical fin channels 202. Thus, if further reduction of the width of base 502 is needed, the liner indentation and recess reflow processes can be repeated one or more times.

Figure 17:
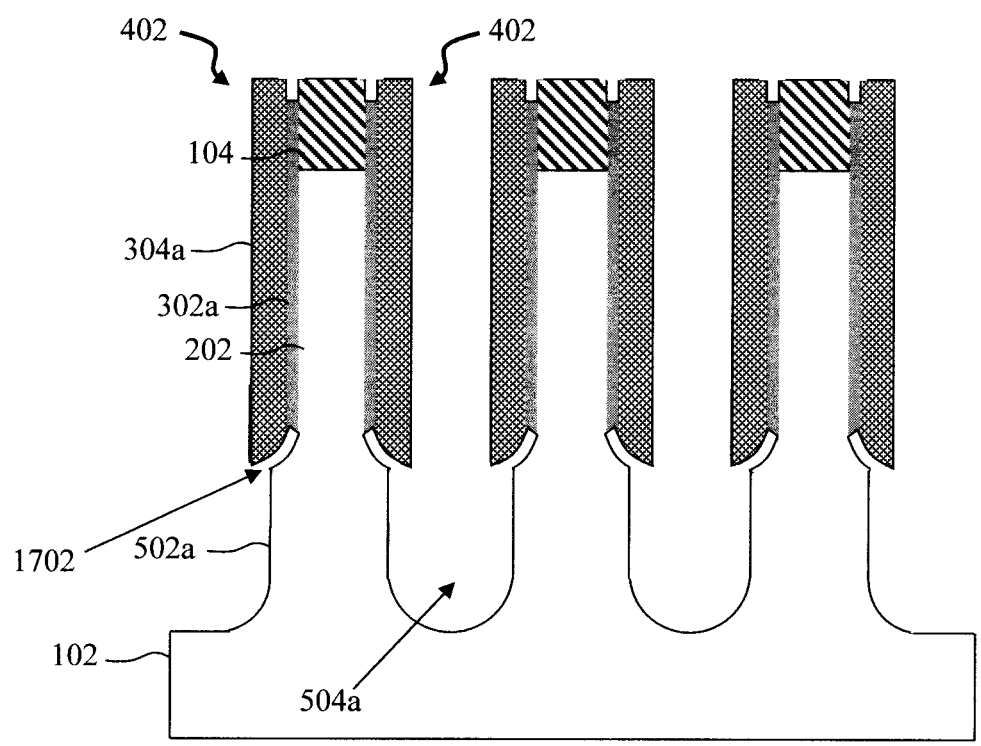
FIG. 17 is a cross-sectional diagram illustrating another (optional) indentation of the liner having been performed at the base of the vertical fin channels according to an embodiment of the present invention.

Namely, another indentation of the (e.g., oxide) liner 302a at the base 502a of the vertical fin channels 202 is next optionally performed. See FIG. 17. As provided above, indentation of liner 302a is needed to enable proper reflow of the underlying substrate material at the base 502a of the vertical fin channels 202. As shown in FIG. 17, indentations 1702 are now present in the liner 302a at the base 502a of the vertical fin channels 202. As provided above, a preclean oxide removal process such as SiConi™ can be employed to indent the (e.g., oxide) liner 302a performed, for example, in the preclean oxide removal chamber of a cluster tool. This preclean process will remove a portion of the exposed liner 302a from in between the (e.g., nitride) spacer layer 304a and the base 502a of the vertical fin channels 202.

Figure 18:
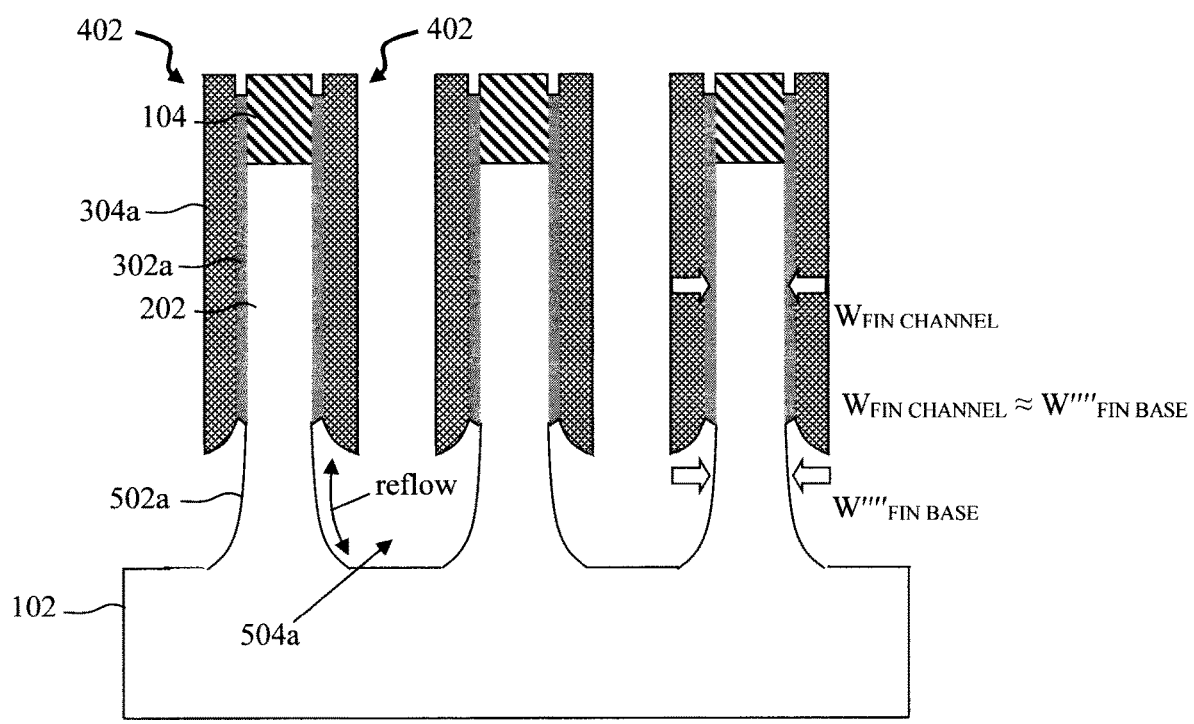
FIG. 18 is a cross-sectional diagram illustrating the substrate and vertical fin channels having been annealed under conditions sufficient to reflow/reshape the recesses, after which the process proceeds to FIG. 10 according to an embodiment of the present invention.

Next, as shown in FIG. 18 the substrate 102 and vertical fin channels 202 are annealed under conditions sufficient to reflow the recesses 504a. As provided above, this anneal can be performed in the epitaxy chamber of a cluster tool. According to an exemplary embodiment, the conditions include, but are not limited to, a temperature of from about 600° C. to about 1000° C. and ranges therebetween, and a duration of from about 1 minute to about 10 minutes and ranges therebetween. Preferably, the reflow anneal is performed in an $H_2$-containing ambient at a pressure of from about 5 Torr to about 600 Torr and ranges therebetween.

As shown in FIG. 18, this recess reflow further reduces the width of the base 502a, i.e., from $W'''_{FIN\ BASE}$ to $W''''_{FIN\ BASE}$, where $W''''_{FIN\ BASE} < W'''_{FIN\ BASE}$. As further shown in FIG. 18, reducing the width of base 502a makes the dimensions of base 502a approximate that of the vertical fin channels 202, i.e., $W_{FIN\ CHANNEL} \approx W''''_{FIN\ BASE}$. For instance, according to an exemplary embodiment, $W''''_{FIN\ BASE} - W_{FIN\ CHANNEL} = x$, wherein x is less than or equal to about 3 nm, e.g., from about 0 nm to about 3 nm and ranges therebetween. However, if further reductions in the width of base 502a are needed, one or more further iterations of the liner indentation and recess reflow processes can be performed.

The remainder of the process proceeds in exactly the same manner as described in conjunction with the description of FIGS. 10-13 above with the formation of the bottom source and drains 1002 in the recesses 504a, removal of the sidewall spacers 402, formation of the bottom spacers 1202 on the bottom source and drains 1002, formation of gate stacks over the bottom spacers 1202 alongside the vertical fin channels 202, formation of top spacers 1302 over the gate stacks, formation of top source and drains 1304 at tops of the vertical fin channels 202, and formation of contacts 1308 over the top source and drains 1304.

Figure 19:
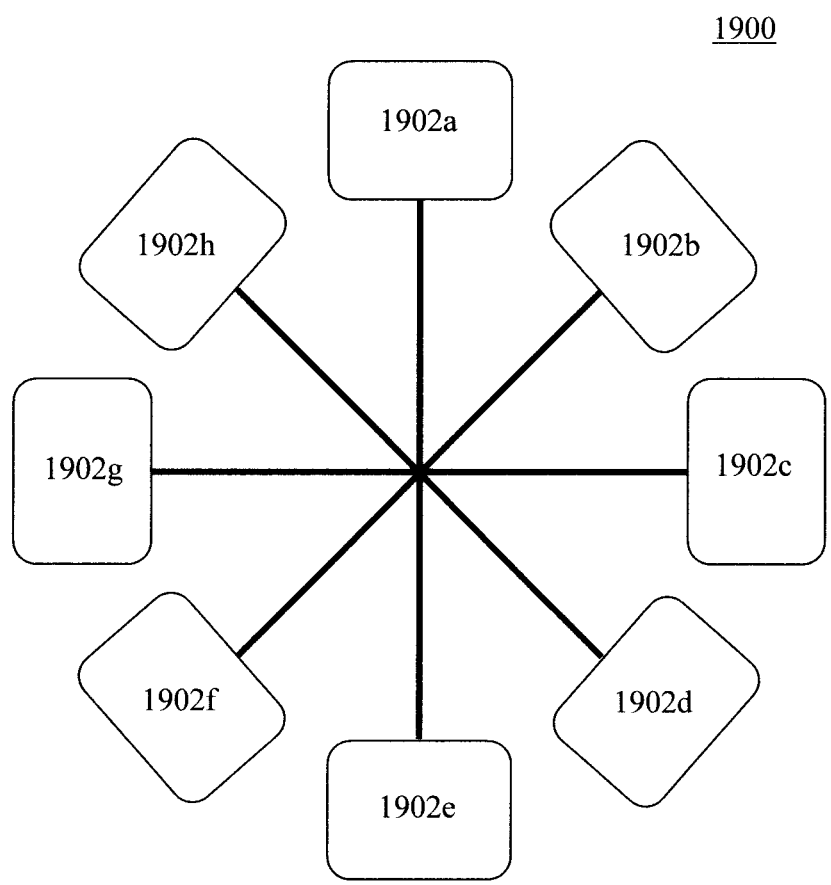
FIG. 19 is a diagram illustrating an exemplary cluster tool for performing one or more methodologies described herein according to an embodiment of the present invention.

As provided above, the iterative process described herein for liner indentation and recess reflow, followed by bottom source and drain epitaxy can be performed using a common tool or platform such as cluster tool 1900. See FIG. 19. As shown in FIG. 19, tool 1900 has multiple processing chambers 1902a-h, etc. According to an exemplary embodiment, at least one of processing chambers 1902a-h, etc. is a preclean oxide removal chamber, and at least another of processing chambers 1902a-h, etc. is an epitaxy chamber. As highlighted above, in the preclean oxide removal chamber(s) a process such as SiConi™ can be employed to indent the (e.g., oxide) liner 302a. The sample is then transferred to one of the epitaxy chambers where a hydrogen ($H_2$) anneal is performed to reflow the recesses 504/504a. This process can be repeated until the desired shaped recesses 504/504a are achieved. Finally, the sample is transferred to one of the epitaxy chambers for formation of the bottom source and drains 1002.

By way of example only, processing chambers 1902a-h, etc. can alternate between preclean oxide removal and epitaxy chambers. For instance, according to an exemplary embodiment, processing chamber 1902a is a preclean oxide removal chamber, whereas the next processing chamber 1902b in the sequence is an epitaxy chamber, followed by chamber 1902c which is a preclean oxide removal chamber, and so on. Samples can then be transferred from chamber to chamber in sequence beginning with preclean oxide removal for indentation of the liner 302a being performed in processing chamber 1902a, followed by reflow of the recesses 504/504a being performed in processing chamber 1902b, then preclean oxide removal for further indentation of the liner 302a being performed in processing chamber 1902c, and so on.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method of forming a vertical transport field effect transistor (VTFET) device, the method comprising the steps of:
   patterning vertical fin channels in a substrate;
   forming sidewall spacers along opposite sidewalls of the vertical fin channels, wherein the sidewall spacers have a bi-layer configuration comprising a liner disposed on the vertical fin channels, and a spacer layer disposed over the liner;
   forming recesses in the substrate at a base of the vertical fin channels;
   indenting the liner at the base of the vertical fin channels;
   annealing the substrate under conditions sufficient to reshape the recesses and reduce a width of the base of the vertical fin channels;
   forming bottom source and drains in the recesses;
   forming bottom source and drain extensions in the substrate adjacent to the bottom source and drains;
   removing the sidewall spacers;
   forming bottom spacers on the bottom source and drains;
   forming gate stacks over the bottom spacers alongside the vertical fin channels;
   forming top spacers over the gate stacks; and
   forming top source and drains at tops of the vertical fin channels.

2. The method of claim 1, wherein the liner comprises an oxide material.

3. The method of claim 2, wherein the oxide material is selected from the group consisting of: silicon oxide (SiOx), silicon oxycarbide (SiOC), and combinations thereof.

4. The method of claim 2, wherein the liner at the base of the vertical fin channels is indented using a preclean oxide removal process.

5. The method of claim 1, wherein the spacer layer comprises a nitride material.

6. The method of claim 5, wherein the nitride material is selected from the group consisting of: silicon nitride (SiN), silicon oxynitride (SiON), silicon-boron-carbonitride (SiBCN), silicon carbide nitride (SiCN), and combinations thereof.

7. The method of claim 1, wherein the annealing is performed in a hydrogen-containing ambient.

8. The method of claim 1, wherein the conditions comprise a temperature and a duration.

9. The method of claim 8, wherein the temperature is from about 600° C. to about 1000° C. and ranges therebetween.

10. The method of claim 8, wherein the duration is from about 1 minute to about 10 minutes and ranges therebetween.

11. The method of claim 1, further comprising the step of:
    performing one or more additional iterations of the indenting and the annealing steps to further reduce the width of the base of the vertical fin channels.

12. The method of claim 1, wherein the bottom source and drains and the top source and drains are each formed from a doped epitaxial material selected from the group consisting of: epitaxial silicon, epitaxial germanium, epitaxial silicon germanium, and combinations thereof.

13. The method of claim 1, further comprising the step of:
    laterally etching the recesses prior to the step of indenting the liner at the base of the vertical fin channels.

14. The method of claim 13, wherein the recesses are laterally etched using hydrochloric acid.

* * * * *